United States Patent
Stahl

(10) Patent No.: US 6,644,384 B2
(45) Date of Patent: Nov. 11, 2003

(54) MODULAR LOW PROFILE COOLING SYSTEM

(75) Inventor: Lennart Stahl, Plano, TX (US)

(73) Assignee: Liebert Corporation, Columbus, OH (US)

( * ) Notice: Subject to any disclaimer, the term of this patent is extended or adjusted under 35 U.S.C. 154(b) by 0 days.

(21) Appl. No.: 10/252,747

(22) Filed: Sep. 23, 2002

(65) Prior Publication Data

US 2003/0079490 A1 May 1, 2003

Related U.S. Application Data

(60) Provisional application No. 60/324,375, filed on Sep. 21, 2001.

(51) Int. Cl.⁷ ............................................. F24H 3/02
(52) U.S. Cl. ........................... 165/54; 165/56; 165/122; 361/724; 454/184
(58) Field of Search .................. 165/54, 56, 122; 361/724; 454/184

(56) References Cited

U.S. PATENT DOCUMENTS

| | | | | |
|---|---|---|---|---|
| 4,632,020 A | * | 12/1986 | Houwer | 454/233 |
| 4,644,443 A | * | 2/1987 | Swensen et al. | 361/687 |
| 5,150,277 A | * | 9/1992 | Bainbridge et al. | 361/695 |
| 5,671,805 A | * | 9/1997 | St.ang.hl et al. | 165/80.3 |
| 5,800,258 A | * | 9/1998 | Knoop et al. | 454/184 |
| 6,164,369 A | * | 12/2000 | Stoller | 165/104.33 |
| 6,520,247 B2 | * | 2/2003 | Hultmark | 165/56 |
| 6,564,858 B1 | * | 5/2003 | Stahl et al. | 165/299 |
| 2001/0052412 A1 | * | 12/2001 | Tikka | 165/299 |

FOREIGN PATENT DOCUMENTS

JP 358085034 A * 5/1983 ................ 165/54

* cited by examiner

Primary Examiner—Terrell McKinnon
(74) Attorney, Agent, or Firm—Howrey Simon Arnold & White LLP

(57) ABSTRACT

A method and system for high density modular cooling system is disclosed. Cooling coils and fans are interleaved so as to cover all usable space with the enclosed area behind the interleaved cooling coils and fans acting as a plenum. A cooling fluid is circulated through the cooling coils by the interleaved fans.

19 Claims, 1 Drawing Sheet

MODULAR LOW PROFILE COOLING SYSTEM

CROSS-REFERENCE TO RELATED APPLICATION

This application claims priority to U.S. Provisional Patent Application Ser. No. 60/324,375, filed Sep. 21, 2001, having the same title and inventor as named herein, which is hereby incorporated by reference in its entirety.

BACKGROUND OF THE INVENTION

1. Technical Field of the Invention

The present invention relates to cooling systems for cooling electronic equipment, and particularly to high density systems such as ceiling and floor mounted systems, to allow increased cooling capacity in a smaller volume.

2. Background and Objects of the Invention

The growth of the computer industry and telephony over the past few decades has been phenomenal. The integration of these technologies, for example, in telecommunications switching and in datacenters, has lead to greater and greater efficiencies as larger numbers of communications are handled by fewer components, which are typically housed in a central control room.

As is readily apparent, if equipment is not effectively cooled, the internal temperature of the electronic components in the equipment substantially increases, thereby leading to significantly reduced system performance and, in some cases, total system failure. If a cooling system inefficiently cools the equipment, either the equipment may fail due to increased operating temperature or the costs for cooling the equipment may be unnecessarily high. What is needed, then, is a cooling system having its cooling characteristics closely tailored to the heating characteristics of the equipment to be cooled.

Additionally there is a premium on space in such environments and an increasing need for cooling capacity. One alternative is to move the cooling system into the ceiling such that the cooling coils, fans and a portion of an enclosed room form an enclosed space behind the cooling coils and fans that is then used as a plenum for returning the cooling fluid to the proximal location of the object to be cooled. Alternatively, the cooling system may be moved into the floor such that the cooling coils, fans and a portion of an enclosed room form an enclosed area behind the cooling coils and fans that is then used as a plenum for returning the cooling fluid to the area to be cooled. Cooling coils and fans are added as necessary to fully enclose the space behind the cooling coils and fans.

SUMMARY OF THE INVENTION

The present invention overcomes the above-discussed shortcomings and satisfies a significant need for reducing space requirements while increasing the cooling capacity of cooling systems.

In accordance with one embodiment of the present invention, a cooling system includes a fan, a heat exchanger such as a cooling coil containing a cooling fluid, air or any other gas that would serve to transfer heat from the heat generating object to the cooling coils, and a volume defined by at least one wall, a first surface such as a ceiling, and a second surface such as a false ceiling. The wall is joined to the first surface forming a partially enclosed area. The second surface comprises a fan and a cooling coil, where the fan and the cooling coil are interleaved with each other. The second surface is coupled to the at least one wall. The first surface, the second surface abuts the wall form forming an essentially enclosed volume to be used as a plenum for the air as the air is moved between the cooling coils and the fan. The fan forces the air out of the plenum towards the heat generating object where heat from the heat generating object is transferred from the heat generating object to the air. As the fan forces the air out of the plenum, the fan in turn creates an area of reduced pressure in the plenum that in turn draws the air into the plenum through the cooling coils. As the air passes through the cooling coils, heat that was transferred from the heat generating object to the air is transferred from the air, through the cooling coils and into the cooling fluid.

BRIEF DESCRIPTION OF THE DRAWINGS

A more complete understanding of the system and method of the present invention may be obtained by reference to the following detailed description when taken in conjunction with the accompanying drawings wherein.

DESCRIPTION OF ILLUSTRATIVE EMBODIMENTS

Figure 1:
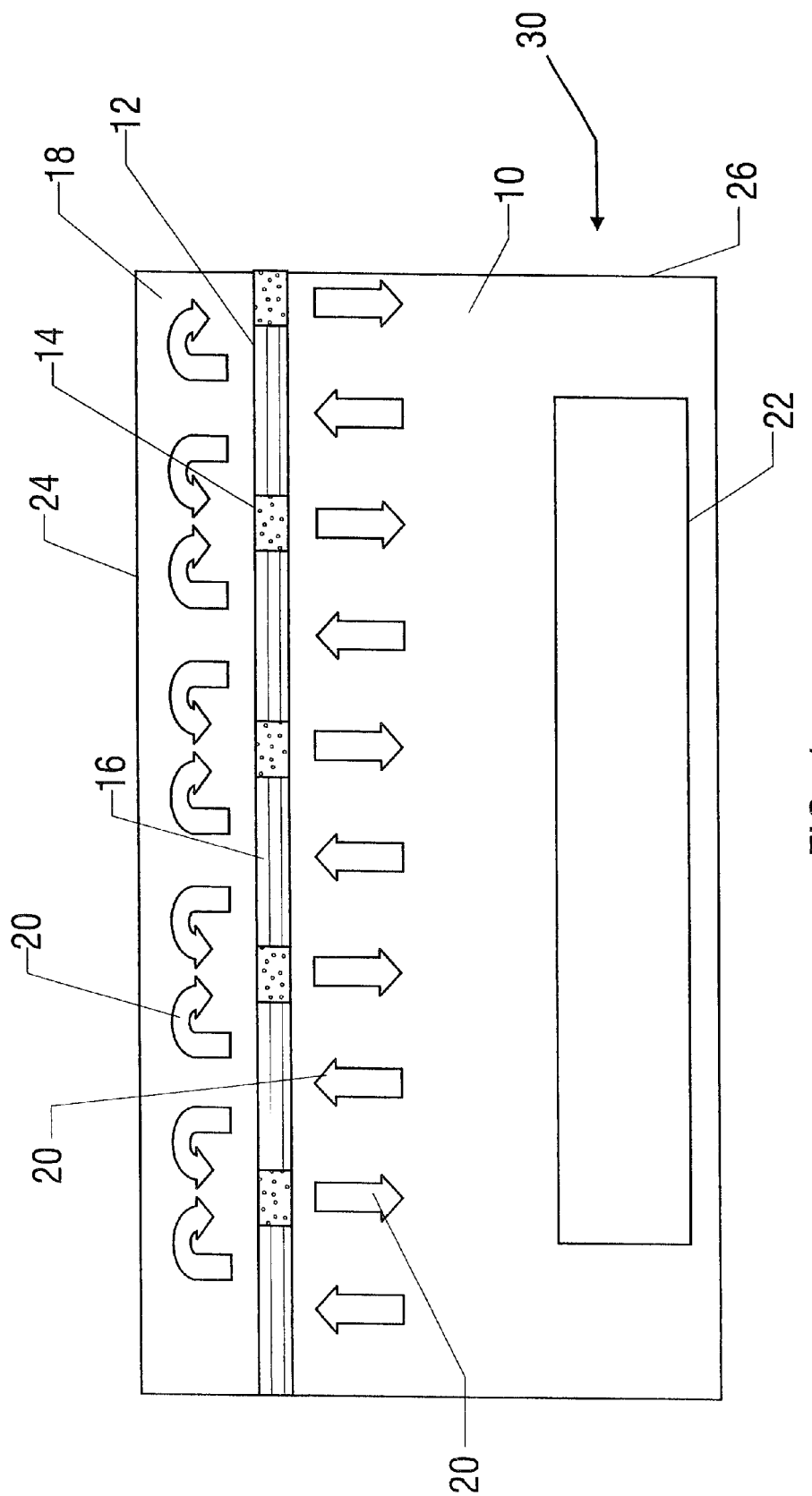
FIG. 1 is a schematic drawing of a high density cooling system located above the heat generating object.

The present invention will now be described more fully hereinafter with reference to the accompanying drawing in which a preferred embodiment of the invention is shown. This invention may, however, be embodied in many different forms and should not be construed as being limited to the embodiment set forth herein.

Referring to FIG. 1, there is shown a cooling system 10 according to an embodiment of the present invention. Cooling system 10 is adapted to include a cooling coil 12 and a fan 14. The fan 14 and the cooling coil 12 are abutted so as to form a second surface 16. A first surface 24 and the second surface 16 are each joined to the wall 26 so as to create an enclosed area which is to be used as a plenum 18. As the fan 14 forces air 20 out of the plenum 18, an area of reduced pressure is created in the plenum 18 which in turn draws the air 20 through the cooling coils 12 where heat is transferred from the air 20 and into the cooling coils 12. The air is then further drawn into the plenum 18. As the air 20 is forced out of the plenum 18, it is directed towards the heat generating object 22 where heat is transferred from the heat generating object 22 to the air 20 prior to the air 20 being drawn back to the cooling coil 12.

A high density cooling system as described herein is advantageous over the prior art. This system saves space by creating a false ceiling by abutting fans and cooling coils. The area between the structural ceiling of the room, the false ceiling and the walls of the room is used as a plenum that increases capacity by maximizing the area available for cooling coils and fans.

It will be apparent to one of skill in the art that described herein is a method and apparatus for a high density cooling system. While the invention has been described with references to specific embodiments, it is not limited to these embodiments. The invention may be modified or varied in many ways and such modifications and variations as would be obvious to one of skill in the art are within the scope and spirit of the invention and are included within the scope of the following claims.

What is claimed is:

1. A cooling system comprising:

A first surface;

a wall sealably engaging said first surface;

a fan;

a cooling coil abutting said fan to form a second surface;

said second surface sealably engages said wall;

said first surface, said second surface and said wall define an enclosed area to be used as a plenum;

a gas may be circulated out of said plenum into proximal location with a heat generating object, then through said cooling coils back into said plenum by said fan.

2. The cooling system of claim 1, wherein said gas may be circulated into said enclosed area then out through said cooling coils by said fan.

3. The cooling system of claim 1, wherein said gas is air.

4. The cooling system of claim 1, wherein said first surface is a ceiling and said second surface forms a false ceiling.

5. The cooling system of claim 1, wherein said first surface is a floor and said second surface forms a false floor.

6. A cooling system comprising:

A first surface and a second surface;

a wall sealably engaging said first surface and said second surface at said walls upper and lower boundaries;

a fan;

a cooling coil abutting said fan to form a third surface;

said third surface sealably engages said first surface, said second surface and said wall;

said first surface, said second surface, said third surface and said wall define an enclosed area to be used as a plenum;

a gas may be circulated out of said plenum into proximal location with a heat generating object, then through said cooling coils back into said plenum by said fan.

7. The cooling system of claim 6, wherein said gas may be circulated into said enclosed area then out through said cooling coils by said fan.

8. The cooling system of claim 6, wherein said gas is air.

9. The cooling system of claim 6, wherein said first surface is a ceiling and said second surface forms a false ceiling.

10. The cooling system of claim 6, wherein said first surface is a floor and said second surface forms a false floor.

11. A method for providing high density cooling comprising:

abutting a fan coil and a fan to form a second surface;

forming an enclosed area by sealably engaging a wall, a first surface and the second surface;

circulating a gas out of said enclosed area into proximal location with a heat generating object through said cooling coils back into said enclosed area by said fan.

12. The method of claim 11, wherein said cooling fluid may be circulated into said enclosed area then out through said cooling coils by said fan.

13. The method of claim 11, wherein said cooling fluid is air.

14. The method of claim 11, wherein said second surface forms a ceiling.

15. The method of claim 11, wherein said second surface forms a floor.

16. A method for providing high density cooling comprising:

interleaving a fan coil and a fan to form a third surface;

forming an enclosed area by coupling a wall, a first surface, a second surface and the third surface;

circulating a gas out of said enclosed area then through said cooling coils back into said enclosed area by said fan.

17. The method of claim 16, wherein said cooling fluid may be circulated into said enclosed area then out through said cooling coils by said fan.

18. The method of claim 16, wherein said cooling fluid is air.

19. The method of claim 16, wherein said third surface forms a wall.

* * * * *